(12) United States Patent
Fernandez

(10) Patent No.: US 7,663,376 B2
(45) Date of Patent: Feb. 16, 2010

(54) PRINTED CIRCUIT BOARD FOR SENSING VOLTAGE DROP

(75) Inventor: Jose Gabriel Fernandez, Valls (ES)

(73) Assignee: Lear Corporation, Southfield, MI (US)

( * ) Notice: Subject to any disclaimer, the term of this patent is extended or adjusted under 35 U.S.C. 154(b) by 238 days.

(21) Appl. No.: 11/890,386

(22) Filed: Aug. 6, 2007

(65) Prior Publication Data

US 2009/0039865 A1    Feb. 12, 2009

(51) Int. Cl.
*G01R 31/02*    (2006.01)
(52) U.S. Cl. ............ 324/555; 324/503; 324/76.11
(58) Field of Classification Search ............ 324/72, 324/76.11, 126, 117 H, 117 R, 555, 503; 338/32 R
See application file for complete search history.

(56) References Cited

U.S. PATENT DOCUMENTS

| | | | |
|---|---|---|---|
| 7,381,101 B2 * | 6/2008 | Roset et al. ............ 439/754 |
| 7,405,570 B2 | 7/2008 | Hirthammer | |
| 2002/0011959 A1 | 1/2002 | Liu | |
| 2002/0024334 A1 | 2/2002 | Dames | |
| 2003/0080835 A1 | 5/2003 | Hreish et al. | |
| 2006/0170529 A1* | 8/2006 | Shoji ............ 338/32 R |
| 2006/0238951 A1 | 10/2006 | Cetiner et al. | |
| 2007/0074905 A1 | 4/2007 | Lin et al. | |
| 2008/0238431 A1 | 10/2008 | Schimmel | |
| 2009/0195252 A1 | 8/2009 | Kerbol | |
| 2009/0212779 A1 | 8/2009 | Wenger | |
| 2009/0224768 A1 | 9/2009 | Dollansky et al | |

FOREIGN PATENT DOCUMENTS

| | | |
|---|---|---|
| DE | 102004049153 A1 | 4/2006 |
| DE | 102005019569 A1 | 11/2006 |
| EP | 1828786 B1 | 7/2009 |
| FR | 2879751 A1 | 6/2006 |

* cited by examiner

*Primary Examiner*—Vincent Q Nguyen
(74) *Attorney, Agent, or Firm*—Brooks Kushman P.C.

(57) ABSTRACT

A printed circuit board (PCB) having capabilities to measure a voltage drop of current flowing therethrough. The PCB may optionally include other capabilities for measuring, calculating, sensing, or other processing of information and data associated with the current flow or other operating conditions associated with the PCB, such as but not limited to those associated with battery monitoring systems.

20 Claims, 3 Drawing Sheets

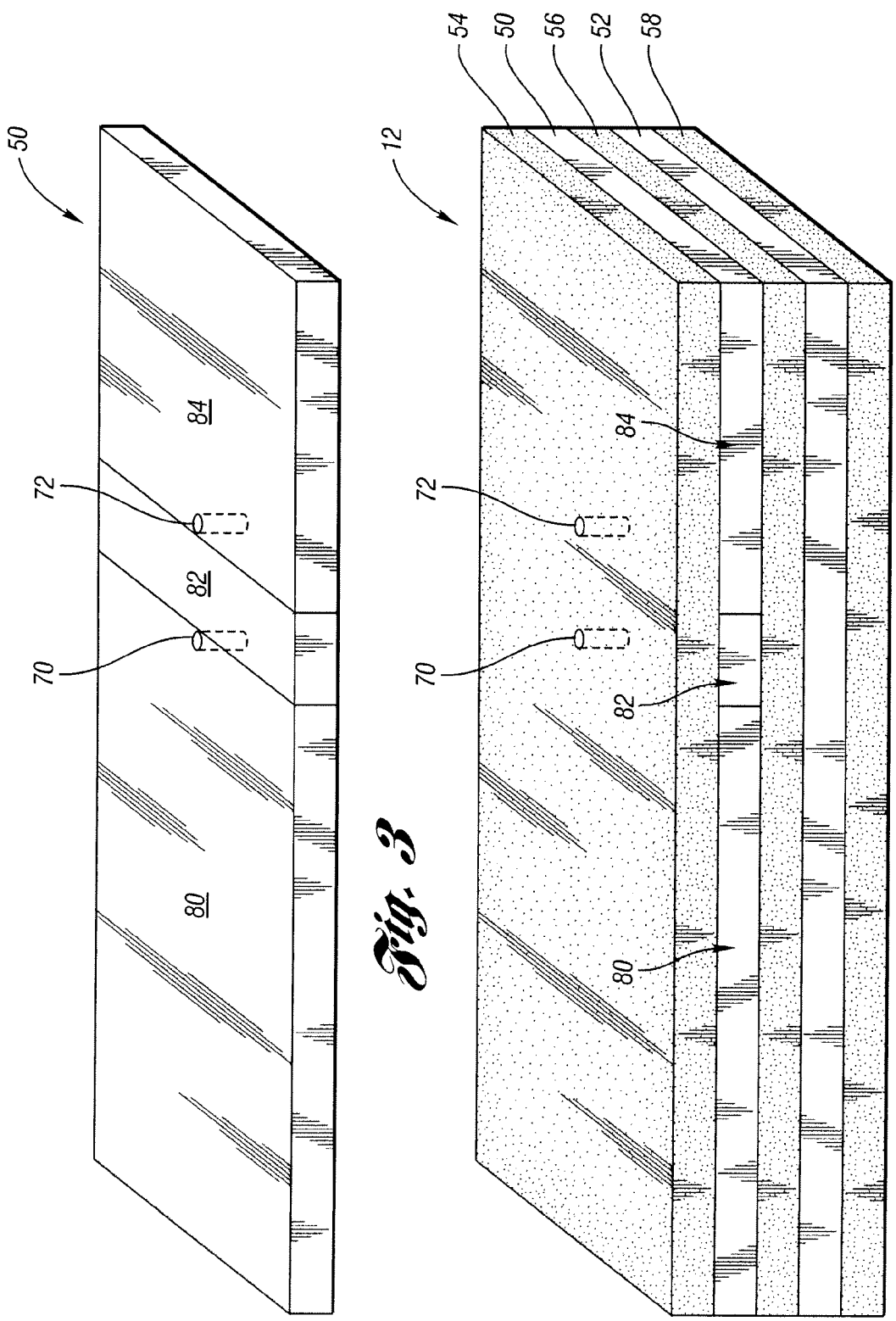

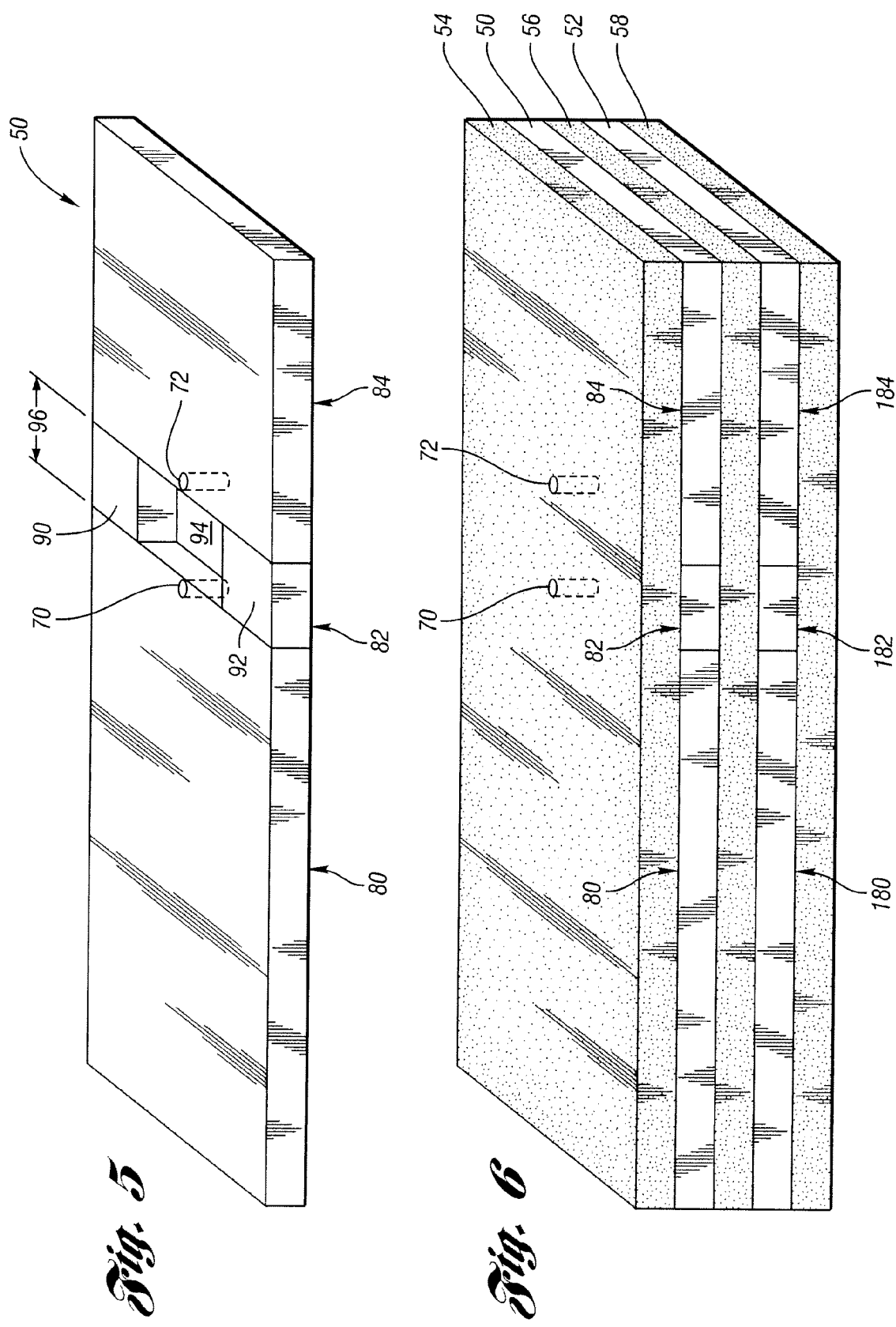

PRINTED CIRCUIT BOARD FOR SENSING VOLTAGE DROP

BACKGROUND OF THE INVENTION

1. Field of the Invention

The present invention relates to printed circuit boards (PCBs) having capabilities to measure a voltage drop across a conducting layer of the PCB.

2. Background Art

Hybrid and non-hybrid vehicles may be equipped with energy storage devices, such as batteries for powering the vehicle and other devices located thereon. A battery monitor may be connected to a battery post and configured to sense battery operating conditions. These type of connectors may be employed in automotive vehicles having lead-acid or some other type of battery or similar energy storage device. The battery monitor may be advantageous in reporting the battery operating conditions to a junction box or other vehicle system controller.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

FIGS. 3-4 schematically illustrates a portion of the battery monitor shown in FIG. 2;

FIG. 5 illustrates an optionally arrangement of the first conducting layer shown in FIG. 3; and FIG. 6 illustrates the battery monitor having the second conducting layer composed of the first and second materials included within the first conducting layers.

DETAILED DESCRIPTION OF THE PREFERRED EMBODIMENT(S)

Figure 1:
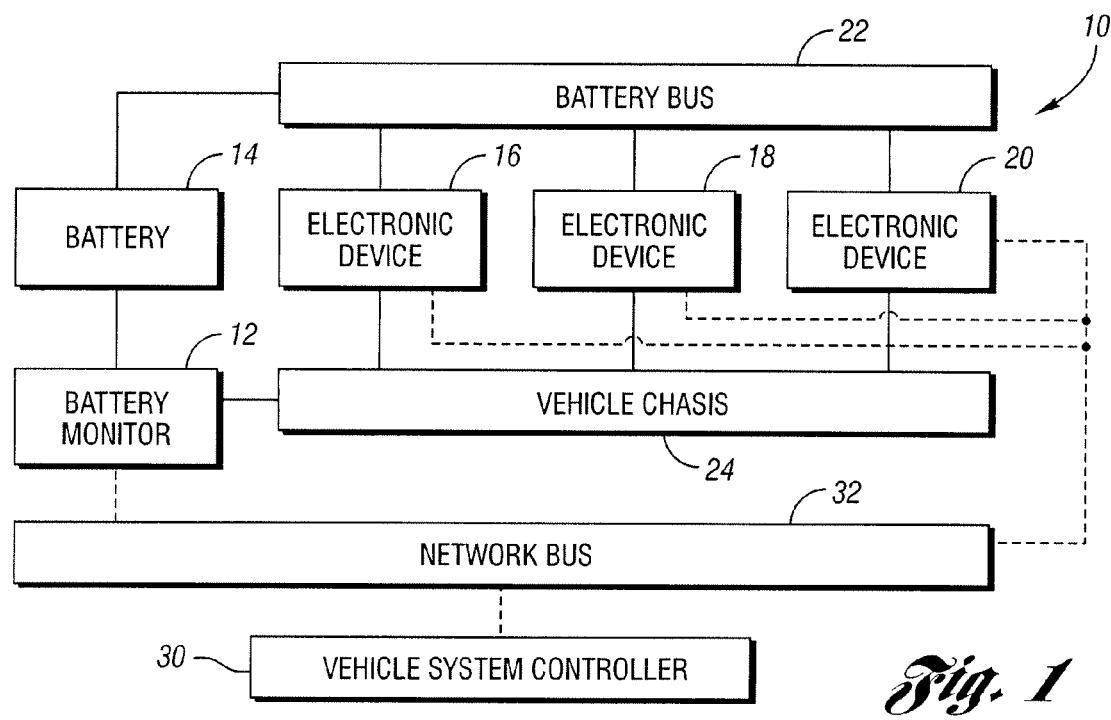
FIG. 1 schematically illustrates a battery monitoring system in accordance with one non-limiting aspect of the present invention.

FIG. 1 schematically illustrates a battery monitoring system 10 in accordance with one non-limiting aspect of the present invention. The system 10 may include a battery monitor 12 for monitoring operating conditions of a battery 14, such as but not limited to a lead-acid or other battery commonly employed within vehicles. The battery 14 may be used to power a number of electronic devices 16-20 in a vehicle (not shown). The electronic devices 16-20 may relate to any number of devices commonly employed to facilitate various vehicle operations, such as but not limited to lighting, entertainment, cooling, and other vehicles systems. A battery bus 22 (wire harness) may be included to facilitate powering the electronic devices.

The electronic devices 16-20 and the battery 14 may be connected to a common vehicle ground by way of a vehicle chassis 24. A vehicle system controller (VSC) 30 may communicate with the electronic devices 16-20 through signals carried over a network bus 32. The VSC 30 may be configured to control operations of the electronic devices 16-20 and to perform any number of other operations associated with any number of vehicle related controls. The battery monitor 12 may be configured or otherwise programmed to support any number of battery monitoring operations, such as but not limited to measuring/sensing current, voltage, and temperature. This information may be communicated over the network bus 32 to the VSC 30 for use in controlling vehicle operations.

Figure 2:
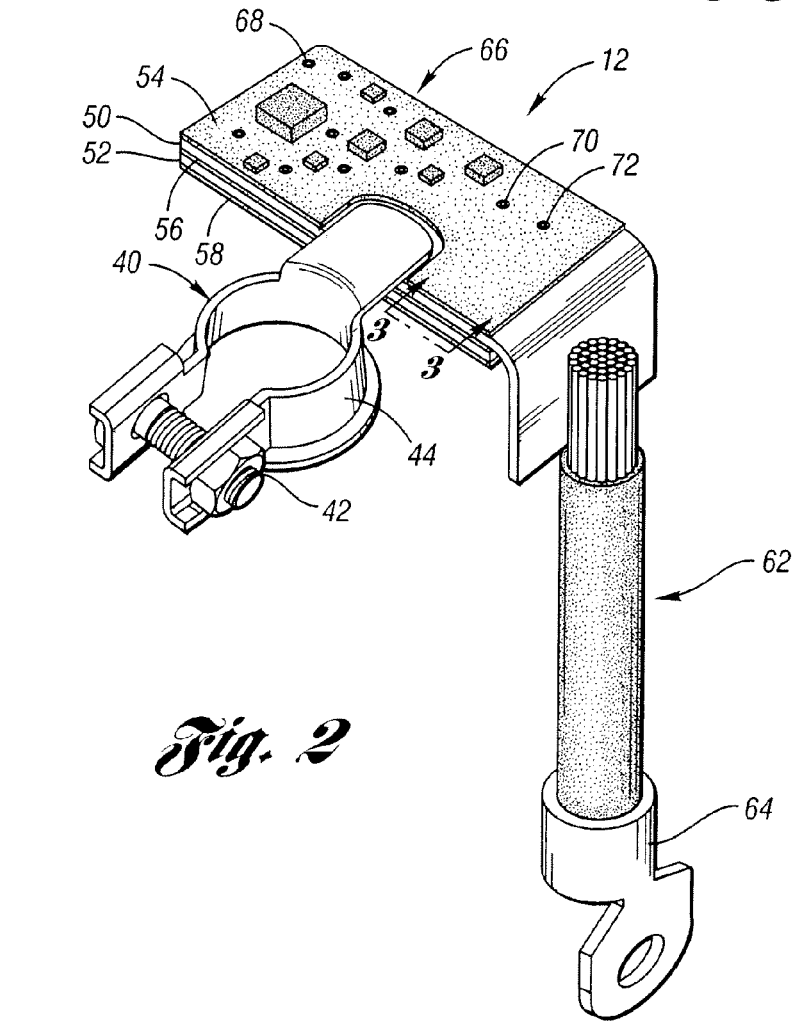
FIG. 2 illustrates the battery monitor in accordance with one non-limiting aspect of the present invention.

FIG. 2 illustrates the battery monitor 12 in accordance with one non-limiting aspect of the present invention. The battery monitor 12 may be electrically connected to the battery 14 with a terminal adapter 40. The terminal adapter 40 may comprise a tinned brass, stamped material, or other material suitable for conducting electricity from the battery 14. The terminal adapter 40 may include a screw 42 and clamp 44 for compressively applying force against a battery post (not shown). The terminal adapter 40 is shown to be configured for attachment to a cylindrical or cone-shaped battery post for exemplary purposes and without intending to limit the scope and contemplation of the present invention. Any type of connection to the battery 14 may be used.

The battery monitor 12 may include multiple conducting 50, 52 and non-conducting layers (planes) 54, 56, 58. The conducting layers 50, 52 may be configured to facilitate current flow between the battery 14 and a cable 62. The cable 62 may be a twisted cable, solid cable, or other suitable cable. The cable 62 may be soldered or otherwise connected to the battery monitor 12 at one end and to the vehicle chassis 24 at the other end, optionally with the assistance of a bracket 64. This allows the battery monitor 12 to act as a shunt or other current transport between the battery 14 and vehicle chassis 24. One or more of the conducting layers 50, 52 may extend away from the non-conducting layers 54, 56, 58 for connection to the cable 24. This layer 50 may be bent or otherwise formed into the illustrated L-shape.

The L-shaped layer 50 may be used to facilitate directionality with respect to the cable 62. The cable 62 may be thick (35 or 50 mm$^2$ section for example), and difficult to bend. The battery monitor may be used to provide the bending, twisting . . . required to fit into an electronic module relief or other space provided on the battery 14. Advantageously, the use of the layer 50 allows the present invention to eliminate the need for a cable terminal at one end of the cable. The battery monitor 12 can be shaped and mechanized so that an inner and thick layer protrudes and is bent to perform the cable "directing" requirements while providing a surface area where it can be soldered or otherwise attached to the cable 62.

A first non-conducting layer 54 may include a number of electronic elements 66. The electronic elements 66 may be soldered or otherwise adhered to the non-conducting layer and configured to monitor, sense, or perform other operations associated with the battery monitor 12. The non-conducting layers 54, 56, 58 may be comprised of any suitable non-conducting material, such as epoxy resins with glass fiber and paper additives (for example FR4 having flame retardant and woven glass reinforced epoxy resin, CEM1, CEM3 epoxy resin with woven glass reinforcement over a paper core, and/or any other suitable material or combination of materials). A number of vias 68 may be included to facilitating electrically connecting the electronic elements to electronic elements 66 on the other non-conducting layers 54, 56, 58 and/or to one or more of the conducting layers 50, 52. The non-conducting layers 54, 56, 58 may include traces (not shown) to facilitate electrical communication with the other electronic elements and/or the vias 68.

One or more of the conducting layers 50, 52 may be comprised of multiple materials. For example, a first one of the conducting layers may be comprised of a first material and a second material. The first material and second material may have different resistivity. The first and second materials may have properties sufficient to facilitate electrical connectivity between the battery 14 and cable 62. The first material may be a copper or copper alloy having a lower resistivity compared to the second material, which may be manganin. The second material may have known resistive characteristics such that its voltage drop can be used to accurately and consistently measure current through conducting layers 50, 52.

Vias 68 may be used to electrically connect a processor included as one of the electronic components 66 to either side of the second material in order to facilitate measuring a voltage drop between the first material on opposed sides of the second material. FIG. 2 illustrates the only first conducting layer 50 including multiple materials. The first conducting layer 50 may be electrically connected to a second conducting layer 52 with the same vias 70, 72 used to measure the voltage drop and/or with other vias extending therebetween. The electrical connecting between the conducting layers may allow current to flow equally or substantially equally between the layers.

FIGS. 3-4 schematically illustrates a portion of the battery monitor 12 shown in FIG. 2. FIG. 3 illustrates the first conducting layer 50 and FIG. 4 illustrates the first and second conducting layers 50, 52 sandwiched between first, second, and third non-conducting layers 54, 56, 58. The first conducting layer 50 may be divided into first, second, and third portions 80, 82, 84. The first and third portions 80, 84 may be comprised of the first material and the second portion 82 may be comprised of the second material, i.e. the material across which the voltage drop is measured.

Vias 70, 72 may extend through from the first non-conducting layer 54 to the third non-conducting layer 58 in order to electrically connect the first and second conducting layers 50, 52 to each other as well as to electrically connect the processor to either side of the second portion 82 of the first conducting layer 50 having the second material. Of course, more or less vias, positioned at the illustrated or other non-illustrated positions, may be included to facilitate electrically connecting the processor to the various conducting layers 50, 52 and/or to facilitate electrically connecting the conducting layers 50, 52 and/or the non-conducting layers 54, 56, 58 to each other.

As shown in FIG. 3, the second portion 82 of the first conducting layer 50 may extend widthwise across an entire width of the first conducting layer 50. The first and third portions 80, 84 may be welded or otherwise secured to the second portion to provide the generally planar arrangement. FIG. 5 illustrates an optional arrangement of the first conducting layer 50 shown in FIG. 3. This arrangement includes the second portion 82 being divided into at least two sections 90, 92. The sections 90, 92 may be spaced apart from each other to provide a space 94 within a gap 96 defined by the distance between the first and third portions 80, 84. The separate sections 90, 92 may be constructed and configured to facilitate selectively determining the equivalent resistance of the shunt.

FIG. 6 illustrates the battery monitor 12 having the second conducting layer 52 composed of the first and second materials included within the first conducting layer 50. The second conducting layer 52 may optionally be a mirror image or copy of first conducting layers describe above. This may include the first and second materials and the first, second, and third portions 180, 182, 184 of each layer being aligned with each other. The first and second conducting layers 50, 52 may be electrically connected such that current passes through each layer 50, 52 equally. The voltage drop across the second material portions 82, 182 of the first and second conducting layers may be the same. The processor may be connected to one or both of the first and/or second conducting layers 50, 52, on either side of the second material, to facilitate measuring the voltage drop.

The foregoing illustrates multiple configurations for the battery monitor in accordance with various aspect of the present invention. These configurations are provided for exemplary purposes and without intending to limit the scope and contemplation of the present invention. The present invention fully contemplates any number of other configurations, including other configurations for the multi-material conducting layers. The conducting layers used to measure the voltage drop may include other arrangements where the second material need not extend widthwise across the entire layer or it need not be configured to bisect the layer into two material portions, i.e., the first material need not be configured to surround the second material.

FIG. 2 illustrates the battery terminal and cable connecting to the first conducting layer. This is for exemplary purposes only. The present invention fully contemplates any number of arrangement for the battery monitor and its connection to the battery terminal and cable, including connecting the battery terminal and/or cable to multiple conducting layers. While the above only describes the battery monitor having two conducting layers, the battery monitor may include any number of conducting layers, optionally with any number of the conducting layers have the second material to facilitate measuring the voltage drop. The voltage drop may be measured commonly across all the layers and/or selectively across one or more of the layers, including separately measuring the voltage drop for different layers.

The battery monitor of the present invention may be adapted or suitable for use in any number of environments and is not intended to be limited to automotive environments. The battery monitor may also be suitable for use with the battery monitoring systems described in pending U.S. Applications owned by the Assignee of the present invention entitled Battery Monitoring System (Ser. No. 11/762,424), Battery Post Connector (Ser. No. 11/672,715), and Battery Post Connector (Ser. No. 11/510,118), the disclosures of which are hereby incorporated in their entirety. The battery monitor of the present invention may integrate the calibrated and stable resistive portion of a shunt component inside the PCB. This may reduce assembly costs over devices, have standalone shunts and simplify connection to other electronic circuit components as, then, only standard vias inside the PCB would be required.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A multilayer printed circuit board (PCB) for use in transferring current from an input to an output, the PCB comprising:
   a first non-conducting plane;
   a first conducting plane adhered to the first non-conducting plane, the first conducting plane electrically connected to both of the input and output to transfer current therebetween, the first conducting plane composed of at least a first material having a first resistivity and a second material having a second resistivity such that current flowing between the input and output flows through both of the first material and the second material, wherein the first material is coplanar with the second material for at least an area defined by the first non-conducting plane; and
   a processor adhered to the first non-conducting plane and in electrical communication with the first material and configured to measure a voltage drop across the second material.

2. The PCB of claim 1 wherein the second resistivity is greater than the first resistivity.

3. The PCB of claim 2 wherein the first material is copper and the second material is a copper alloy.

4. The PCB of claim 3 wherein the second material is manganin.

5. The PCB of claim 1 wherein the first conducting plane is flat between the input and the output.

6. The PCB of claim 1 wherein the first material is positioned along opposed sides of the second material.

7. The PCB of claim 1 wherein the second material extends widthwise across from one side of the first conducting plane to the other side of the first conducting plane.

8. The PCB of claim 1 wherein the second material defines a gap within the first material that extends widthwise across from one side of the conducting plane to the other side of the first conducting plane, the second material including at least two sections within the gap to define a space between each section and within the gap.

9. The PCB of claim 1 further comprising a second non-conducting plane adhered to the first conducting plane and a second conducting plane adhered to the second non-conducting plane, the second conducting plane composed of at least a third material having a third resistivity and a fourth material having a fourth resistivity, the first material of the first conducting plane being in electrical communication with the third material of the second conducting plane, the processor also being in electrical communication with the third material and configured to measure voltage drop across the second and fourth material.

10. The PCB of claim 9 wherein the first and third materials have the same resistivity and the second and fourth materials have the same resistivity.

11. The PCB of claim 9 wherein the first material is aligned with the third material and the second material is aligned with the fourth material.

12. The PCB of claim 9 wherein current flow through the first conducting plane is equal to current flow through the second conducting plane.

13. The PCB of claim 9 further comprising vias for electrically connecting the first and third materials and the processor.

14. A battery monitoring system for monitoring a battery used to power a number of electronic devices connected to a vehicle chassis within a vehicle, the system comprising:
   a battery monitor having a first non-conducting layer and a first conducting layer, the first conducting layer composed of at least a first material having a first resistivity and a second material having a second resistivity, the battery monitor further including a processor in electrical communication with the first material to measure a voltage drop across the second material;
   a battery terminal adapter for connecting the first conducting layer to a post of the battery; and
   a cable for connecting the first conducting layer to the vehicle chassis such that current flow between the electronic devices and the battery must flow through the first conducting layer.

15. The system of claim 14 wherein the battery monitor further comprising a second non-conducting layer adhered to the first conducting layer and a second conducting layer adhered to the second non-conducting layer, the second conducting layer composed of at least a third material having a third resistivity and a fourth material having a fourth resistivity, the first material of the first conducting layer being in electrical communication with the third material of the second conducting layer, the processor also being in electrical communication with the third material and configured to measure voltage drop across the second and fourth material.

16. The system of claim 15 wherein the battery terminal adapter is welded to the first and second conducting layers.

17. The system of claim 15 wherein the cable is welded to the first and second conducting layers.

18. The system of claim 15 wherein the first and third materials have the same resistivity and the second and fourth materials have the same resistivity.

19. The PCB of claim 18 wherein the first material is aligned with the third material and the second material is aligned with the fourth material.

20. The PCB of claim 18 wherein current flow through the first conducting layer is equal to current flow through the second conducting layer.

* * * * *